(12) United States Patent
Scarsbrook et al.

(10) Patent No.: US 7,160,617 B2
(45) Date of Patent: Jan. 9, 2007

(54) BORON DOPED DIAMOND

(76) Inventors: Geoffrey Alan Scarsbrook, 40 Cavendish Mead, Sunninghill, Ascot, SL5 9TD, Berkshire (GB); Philip Maurice Martineau, Littlewick End, Coronation Road, Littlewick Green, SL6 3RA, Berkshire (GB); Daniel James Twitchen, 10 Park Drive, Sunningdale, SL5 0BD, Berkshire (GB); Andrew John Whitehead, 60 Cheylesmore Drive, Camberley, GU16 9BW, Surrey (GB); Michael Andrew Cooper, 28 Clifton Road, Wokingham, Berkshire (GB); Bärbel Susanne Charlotte Dorn, 11 Slaidburn Green, Forest Park, Bracknell, RG12 OWG, Berkshire (GB)

( * ) Notice: Subject to any disclaimer, the term of this patent is extended or adjusted under 35 U.S.C. 154(b) by 0 days.

(21) Appl. No.: 10/653,419

(22) Filed: Sep. 3, 2003

(65) Prior Publication Data

US 2004/0180205 A1  Sep. 16, 2004

Related U.S. Application Data

(63) Continuation of application No. 10/319,573, filed on Dec. 16, 2002, now abandoned.

(30) Foreign Application Priority Data

Dec. 14, 2001  (GB) ................................. 0130005.2

(51) Int. Cl.
*B32B 9/00*  (2006.01)
(52) U.S. Cl. .......................... 428/408; 63/32; 117/928; 117/929; 423/446; 427/249.1; 427/249.5; 427/249.8; 427/307; 427/334; 427/577

(58) Field of Classification Search ................ 423/446; 428/408, 334, 704, 698; 117/928, 929; 63/32; 427/249.1, 5, 8, 307, 534, 577
See application file for complete search history.

(56) References Cited

U.S. PATENT DOCUMENTS

| 5,081,438 | A | * | 1/1992 | Nakahata et al. ....... 338/22 SD |
| 5,381,755 | A | * | 1/1995 | Glesener et al. .............. 117/88 |
| 5,387,310 | A | * | 2/1995 | Shiomi et al. .............. 117/101 |
| 5,400,738 | A | * | 3/1995 | Shiomi et al. ................ 117/84 |
| 5,614,019 | A | * | 3/1997 | Vichr et al. .................. 117/84 |
| 5,635,258 | A | * | 6/1997 | Chen et al. ................. 427/577 |
| 5,981,057 | A | * | 11/1999 | Collins ....................... 428/408 |
| 6,080,378 | A | * | 6/2000 | Yokota et al. .............. 423/446 |
| 6,582,513 | B1 | * | 6/2003 | Linares et al. ............. 423/446 |
| 2004/0175499 | A1 | | 9/2004 | Twitchen et al. |
| 2004/0177803 | A1 | | 9/2004 | Scarsbrook et al. |
| 2004/0180205 | A1 | | 9/2004 | Scarsbrook et al. |
| 2004/0182308 | A1 | | 9/2004 | Scarsbrook et al. |
| 2004/0194690 | A1 | | 10/2004 | Twitchen et al. |
| 2004/0221795 | A1 | | 11/2004 | Scarsbrook et al. |
| 2004/0229464 | A1 | | 11/2004 | Godfried et al. |

* cited by examiner

*Primary Examiner*—Archene Turner
(74) *Attorney, Agent, or Firm*—Oblon, Spivak, McClelland, Maier & Neustadt, P.C.

(57) ABSTRACT

A layer of single crystal boron doped diamond produced by CVD and having a total boron concentration which is uniform. The layer is formed from a single growth sector, or has a thickness exceeding 100 μm, or has a volume exceeding 1 mm$^3$, or a combination of such characteristics.

49 Claims, No Drawings

BORON DOPED DIAMOND

BACKGROUND OF THE INVENTION

This invention relates to doped diamond and more particularly to doped diamond produced by chemical vapour deposition (hereinafter referred to as CVD diamond).

There are a range of applications of diamond for which a doped diamond layer of significant dimensions, with a uniform dopant concentration and associated electronic and/or optical properties would be advantageous. Dependent on the detailed application, this material needs to substantially exclude detrimental electronic or optically active traps or defects. To date, material of this type has not been available.

Applications such as high power electronics require bulk free standing diamond with thicknesses ranging from 50 to 1000 μm and lateral sizes varying from $1 \times 1$ mm$^2$ to $50 \times 50$ mm$^2$. For viable production in a competitive market it is beneficial that the diamond used for these structures is grown as a bulk material and processed into the final devices. In addition, wafer scale processing is possible with larger pieces, further reducing device fabrication costs. For optical applications, such as filters and absorbed power measurement devices, the large size and thickness of the raw material can be an intrinsic requirement of the device. Thus there are a range of benefits to synthesising thick layers.

Boron is the only known dopant in diamond which has well characterised relatively shallow dopant behaviour. Other potentially shallow dopants reported in the literature to be under investigation include S, P, O, Li, but these are not yet available as reliable bulk dopants. There are many electronic applications which need doped diamond, often over relatively large areas and with very uniform properties. However, the incorporation of boron during synthesis is a very sensitive property of the particular growth sector. Polycrystalline diamond contains a random selection of growth sectors, and although the average boron concentration may be uniform on a scale much larger than the grain size, at the same scale as the grain size the local boron concentration varies substantially from point to point.

Dopants can also be put into diamond by post growth treatment. The only currently reliable post growth treatment applicable to diamond is ion implantation, and this provides a method of producing layered diamond structures, but not uniform bulk doping. For instance, a 'p-i' (p-type—intrinsic) structure can be produced by using an appropriate dose and energy for boron implantation into a high quality natural type IIa diamond. Unfortunately residual damage (vacancies and interstitials) is always created under conditions of ion implantation. This damage is impossible to remove completely, although annealing treatments can reduce it. The damage leads to degraded charge carrier properties resulting from defect scattering and compensation of boron acceptors.

Methods of depositing or growing material such as diamond on a substrate by chemical vapour deposition (CVD) are now well established and have been described extensively in the patent and other literature. Where diamond is being deposited on a substrate by CVD, the method generally involves providing a gas mixture which, on dissociation, can provide hydrogen or a halogen (e.g. F,Cl) in atomic form and C or carbon-containing radicals and other reactive species, e.g. $CH_x$, $CF_x$ wherein x can be 1 to 4. In addition, oxygen containing sources may be present, as may sources for nitrogen, and for boron. In many processes inert gases such as helium, neon or argon are also present. Thus, a typical source gas mixture will contain hydrocarbons $C_xH_y$ wherein x and y can each be 1 to 10 or halocarbons $C_xH_yHal_z$ wherein x and z can each be 1 to 10 and y can be 0 to 10 and optionally one or more of the following: $CO_x$, wherein x can be 0.5 to 2, $O_2$, $H_2$ and an inert gas. Each gas may be present in its natural isotopic ratio, or the relative isotopic ratios may be artificially controlled; for example hydrogen may be present as deuterium or tritium, and carbon may be present as $^{12}C$ or $^{13}C$. Dissociation of the source gas mixture is brought about by an energy source such as microwaves, RF (radio frequency) energy, a flame, a hot filament or jet based technique and the reactive gas species so produced are allowed to deposit onto a substrate and form diamond.

CVD diamond may be produced on a variety of substrates. Depending on the nature of the substrate and details of the process chemistry, polycrystalline or single crystal CVD diamond may be produced.

Obtaining incorporation of boron into the solid during deposition is less difficult than for many other potential dopants. The incorporation ratio for boron, which is the ratio of the dopant boron (B) to carbon (C) concentration in the solid ([B]/[C]:solid), compared to that in the depositing gas ([B]/[C]:gas) is generally about 1 (in the {100} growth sector) although it varies with many factors. There are many methods by which CVD diamond may be doped during synthesis with boron. With microwave plasma, hot filament and arc jet techniques, diborane ($B_2H_6$) or some other appropriate gas may be added to the gas stream, the incoming gases may be bubbled through methanol or acetone containing boria ($B_2O_3$), boron powder may be placed in the chamber, or a boron rod inserted into the plasma. For growth by the combustion flame method a fine mist of methanol containing boric acid can be injected into the gas stream with an atomiser. Diamond films have also been doped unintentionally when, for example, the plasma has decomposed a substrate holder fabricated from hexagonal boron nitride.

Nitrogen can also be introduced in the synthesis plasma in many forms. Typically these are $N_2$, $NH_3$, air and $N_2H_4$.

Although high purity single crystal (SC) CVD diamond has an important role in potential high power electronics, the number of potential applications would be substantially increased if a CVD doped diamond with uniform and advantageous electronic properties was available. In addition, there are other applications of boron doped diamond where uniformity in the colour, luminescence, or other properties associated with B doping is advantageous.

SUMMARY OF THE INVENTION

According to a first aspect of the invention, there is provided a layer of single crystal boron doped diamond produced by CVD wherein the total boron concentration is uniform, with a variation over the majority volume which is less than 50%, and preferably less than 20%, measured with a lateral resolution at each measurement point of less than 50 μm, and preferably with a lateral resolution at each measurement point of less than 30 μm, and having at least one of the characteristics (i) to (iii):

(i) the layer is formed from a single growth sector, which is preferably one of the {100}, the {113}, the {111} and the {110}, and more preferably the {100}, sectors, (ii) the layer thickness exceeds 100 μm, and preferably exceeds 500 μm, and (iii) the volume of the layer exceeds 1 mm$^3$, and preferably exceeds 3 mm$^3$, and more preferably exceeds 10 mm$^3$, and even more preferably exceeds 30 mm$^3$.

The term "majority volume" as used herein and in the claims represents at least 70%, preferably greater than 85%, and more preferably greater than 95%, of the total volume of the diamond layer.

The CVD single crystal boron doped diamond layer of the invention may also contain nitrogen as a dopant. The diamond layer will generally contain a nitrogen concentration no greater than ⅕ of that of the boron concentration, and preferably less than frax;1;50 of that of the boron *concentration*.

The diamond layer is preferably of "high crystalline quality". In this context "high crystalline quality" allows the presence of the dopant boron atoms and nitrogen atoms and associated point defects such as those including vacancies, hydrogen and the like.

The single crystal boron doped diamond layer may also have one or more of the following characteristics in the majority volume of the diamond, where that majority volume is defined as above:

(a) the layer contains an uncompensated boron concentration greater than $1\times10^{14}$ atoms/cm$^3$ and less than $1\times10^{20}$ atoms/cm$^3$, preferably an uncompensated boron concentration greater than $1\times10^{15}$ atoms/cm$^3$ and less than $2\times10^{19}$ atoms/cm$^3$, and more preferably an uncompensated boron concentration greater than $5\times10^{15}$ atoms/cm$^3$ and less than $2\times10^{18}$ atoms/cm$^3$, b) a hole mobility ($\mu_h$) measured at 300K which exceeds $$\mu_h = G \times 2.1\times10^{10}/(N_h^{0.52}) \quad \text{(Equation 1)}$$

for $N_h$ not exceeding $8\times10^{15}$ atoms/cm$^3$ $$\mu_h = G \times 1\times10^{18}/N_h \quad \text{(Equation 2)}$$

for $N_h$ greater than $8\times10^{15}$ atoms/cm$^3$ where $N_h$ is the concentration of holes (or equivalently, the concentration of ionised boron acceptors), the functional relationship between $\mu_h$ and $N_h$ is based on current models and the value of G represents the gain over the best values of $\mu_h$ currently reported. G has a value of greater than 1.1, and preferably a value greater than 1.4, and more preferably a value greater than 1.7, and even more preferably a value greater than 2.0.

(c) Low or absent luminescent features at 575 and 637 nm, relating to nitrogen-vacancy (N-V) centres. Specifically, the ratio of integrated intensities of the nitrogen vacancy centre zero-phonon lines at 575 nm and 637 nm centre is less than ⅟50, and preferably less than ⅟100, and more preferably less than ⅟300 the integrated intensity of the diamond Raman line at 1332 cm$^{-1}$ when measured at 77 K with 514 nm Ar ion laser excitation.

(d) A Raman line width as measured at 300K of less than 4 cm$^{-1}$ FWHW (full width at half maximum height) and preferably less than 3 cm$^{-1}$ and more preferably less than 2.5 cm$^{-1}$, under 514 nm Ar ion excitation.

(e) A high degree of uniformity in the uncompensated boron concentration as measured by FTIR using the method described below. In particular, the frequency distribution of uncompensated boron measurements taken by FTIR over a representative sample taken from the layer must be such that 90% of the measurements vary by less than 50%, and preferably by less than 30%, expressed as a percentage of the mean.

(f) A uniform bound exciton emission (BE) at 238 nm consistent with the concentration of uncompensated substitutional boron atoms in the solid, measuring the BE at 77 K under UV excitation using the method described below. In particular, the frequency distribution of the BE taken by this method over any representative surface of the layer or sample taken from the layer must be such that 90% of the measurements vary by less than 50%, and preferably by less than 30%, expressed as a percentage of the mean.

(g) A strong free exciton (FE) intensity measured at 77 K under UV excitation, with a high degree of uniformity measured using the method given below. In particular, the frequency distribution of FE measurements taken by this method over any representative surface of the layer or sample taken from the layer must be such that 90% of the measurements vary by less than 50%, and preferably by less than 30%, expressed as a percentage of the mean.

The high mobility found in the CVD diamond of the invention is surprising. The current model for the variation of the mobility with concentration of carriers (or ionised acceptors), in the domain where the carrier concentration is greater than $8\times10^{15}$ atoms/cm$^3$, is based on the belief that the acceptor boron atoms are the dominant scattering mechanism, and that their contribution is essentially intrinsic to their presence. Consequently this model suggests that values higher than this cannot be achieved. In contrast therefore, the results of the work described herein show the model to be in error, in that other factors, which can be removed, have previously limited the mobility in doped diamond reported in the literature.

The single crystal boron doped CVD diamond layer of the invention may be free standing or form a layer or region of a larger diamond body or layer. That larger diamond layer or body may be single crystal or polycrystalline diamond produced by CVD or other synthetic method. That larger diamond layer or body may be doped with boron, nitrogen or other elements.

The diamond layer or body of the invention may take the form of a gemstone.

According to another aspect of the invention there is provided a method of producing a layer of boron doped single crystal CVD diamond. This method includes the steps of providing a diamond substrate having a surface which is substantially free of crystal defects, providing a source gas, such source gas including a source of boron, dissociating the source gas and allowing homoepitaxial diamond growth on the surface which is substantially free of crystal defects thereby producing a layer of single crystal boron doped diamond, preferably of the type described above. Essential to this method is that the diamond growth takes place on a diamond surface that is substantially free of crystal defects.

The method of the invention may additionally include the use of controlled nitrogen additions to the source gas. The nitrogen in the source gas provides an additional means of control of the morphology developed by the growing single crystal, and the incorporation ratio for nitrogen is substantially lower than that for boron. Thus nitrogen additions, calculated as molecular nitrogen, in the range greater than 0.5 ppm and less than 10000 ppm, and preferably in the range greater than 1 ppm and less than 1000 ppm, and more preferably in the range greater than 3 ppm and less than 200 ppm do not adversely affect the electronic properties of the boron doped layer significantly, since the doped material intentionally has boron present as a scattering centre, but does enhance the size of the {100} growth sector and reduce the size of competing growth sectors such as the {111}. This means that, for growth on a {100} plate, the addition of nitrogen enables the growth to remain substantially {100} growth sector. Those skilled in the art will appreciate that the stage of using nitrogen to modify the morphology, and the stage of growing the uniformly boron doped layer may be separated or sequential.

The uniformly boron doped diamond of the invention thus enables a wide range of applications in areas such as electronic, detectors, high power electronics etc. In addition, there are other applications where the uniformity in the colour, luminescence, or other properties associated with uniform boron doping is advantageous. For example, in certain applications such as a cutting blade, boron may be used to colour the diamond thus improving visual control, and uniformity in the colour can be perceived as a factor indicating quality. Alternatively the diamond may be used in decorative applications such as polished gemstones, where uniformity in colour is again generally perceived as a quality factor.

For the various applications mentioned above, the diamond layer or body may be used as such or it may be severed, by cutting for example, to produce two or more and generally a large number of smaller pieces or elements which will find use in one or more of the applications described above. The shape and size of the piece or element will be dictated by the application.

DETAILED DESCRIPTION OF THE INVENTION

In addition to the characteristics described above, the layer of single crystal boron doped CVD diamond of the invention may have one or more of the following characteristics in the majority volume of the diamond layer, the majority volume being that defined above:

1. A level of any single impurity: Si, P, S, Ni, Co, Al, Mn, Fe of not greater than 1 ppm and a total content of these impurities of not greater than 5 ppm. Preferably the level of any of these impurities, other than B and N, is not greater than 0.05 to 0.5 ppm and the total content of these impurities is not greater than 0.5 to 2 ppm.
2. A cathodoluminescence (CL) emission signal in the 575 nm band which is low or absent, and an associated photoluminescence (PL) line, measured at 77 K under 514 Ar ion laser excitation (nominally 300 mW incident beam) which has an integrated peak area less than $\frac{1}{50}$ and preferably less than $\frac{1}{100}$ and more preferably less than $\frac{1}{300}$ of the integrated peak area of the diamond Raman peak at 1332 $cm^{-1}$.
3. In electron spin paramagnetic resonance (EPR), a neutral single substitutional nitrogen centre [N-C]° at a concentration less than 40 ppb and more typically less than 10 ppb.
4. In EPR, a spin density less than $1 \times 10^{17}$ $cm^{-3}$ and more typically less than $5 \times 10^{16}$ $cm^{-3}$ at g=2.0028. In single crystal diamond this line at g=2.0028 is related to lattice defect concentrations and is typically large in natural type IIa diamond, in CVD diamond plastically deformed through indentation, and in poor quality homoepitaxial diamond.
5. Excellent optical properties having a UV/Visible and IR (infrared) transparency close to the theoretical maximum for type IIb diamond and, more particularly, low or absent single substitutional nitrogen absorption at 270 nm in the UV (ultraviolet), and low or absent C—H stretch bands in the spectral range 2500 to 3100 $cm^{-1}$ wavenumbers in the IR. The absorption spectrum of semiconducting boron doped diamond is characterised by a continuum absorption starting at about 370 meV in the near infrared spectral region, and extending into the visible region to about 2.2 eV. This absorption is responsible for the characteristic blue colour (pale blue for concentrations $\sim 5 \times 10^{15}$ $cm^{-3}$ and very dark blue to black for $\sim 5 \times 10^{19}$ $cm^{-3}$). Three prominent bands at 304, 348 and 363 meV are observed at energies below the continuum threshold which, if measured at low temperature with high resolution, exhibit a considerable amount of fine structure.
6. X-ray topographs showing features related to growth where <100> edges of the original substrate are grown out to form <110> edges.

As the concentration of the potentially compensating nitrogen is substantially lower than that of the boron, uniformity in the uncompensated boron distribution is generally indicative of uniformity in the total boron concentration.

In addition, the electronic properties are primarily dependent on the uncompensated boron concentration rather than the total boron concentration. Thus uniformity in the uncompensated boron is an important parameter.

Diamond containing uncompensated boron shows a characteristic one-phonon absorption feature with a maximum at 1282 $cm^{-1}$ (159 meV). It has been found that there is a linear relationship between the concentration of uncompensated boron and the contribution of this band to the absorption coefficient at 1282 $cm^{-1}$. The concentration of boron in ppm is 1.2× (Absorption Coefficient at 1282 $cm^{1}$) when the measurement is carried out at room temperature.

Diamond containing uncompensated boron also shows a characteristic absorption at 2457 $cm^{-1}$ (304.5 meV) that can be revealed by subtraction of the intrinsic two-phonon absorption. When the feature at 1282 $cm^{-1}$ is too weak to be usable, the uncompensated boron concentration can be derived from the integrated absorption coefficient of the band at 2457 $cm^{-1}$ using the relationship:

uncompensated B conc. (ppm)=0.00142×integrated absorption coefficient at 2457 $cm^{-1}$ (meV. $cm^{-1}$).

A bulk measurement of the uniformity of the concentration of the uncompensated boron in a parallel sided diamond sample can be made using FTIR absorption spectroscopy in the following way. A representative map of the infrared absorption characteristics over the whole sample is built up by collecting FTIR spectra at room temperature with a 0.5 $cm^{-1}$ resolution and an aperture size of 0.5 mm, the map containing a minimum of 20 datapoints. One of the relationships above is then chosen based on the average measurement taken and used to derive the concentration of uncompensated boron for each position. The uniformity is then judged from the frequency plot of the concentration measurements taken, assessing the percentage of measurements further away from the average than the limit to the deviation set.

The ultraviolet cathodoluminescence spectra (recorded at 77 K) of high quality boron doped diamond shows strong boron bound exciton emission at 5.22 eV (237.5 nm) and free exciton emission at 5.27 eV (235.2 nm). For high quality diamond with boron concentrations up to approximately 1 ppm, there exists an approximate proportionality between the ratio of the integrated intensities of these two emissions measured at 77 K and the concentration of uncompensated boron. This is given by the relationship:

[uncompensated B in ppm]=1.86×I(B bound exciton intensity)/I(free exciton intensity).

Across a wide range of boron concentrations measurement of this ratio at different positions across a sample can be used to judge the uniformity of the characteristics of the diamond in the near surface region. The sample is coated with a thin (5 nm), uniform layer of gold to prevent charging effects, mounted at 77 K in an scanning electron microscope and a MonoCL system is used to collect UV CL spectra with an accelerating voltage of 15 kV, a current of 0.2 microamps and a spot size of less than 10 μm×10 μm.

The UV CL characteristics of a sample can be mapped by collecting spectra at positions defined by the intersection points of a grid made up of two sets of perpendicular lines with a spacing of 500 μm or 1 mm dependent on the area to be covered, aquiring data at a minimum of 30 points The uniformity is then judged from the frequency plot of the concentration measurements taken, assessing the total width of the distribution of 90% of the measurements expressed as a percentage of the mean value. This procedure was applied to the measured intensity of the bound exciton and free exciton emission, and to the calculated ratio of the two intensities.

Where there is significant variation in trapping defects that quench the bound exciton emission, then these increase the variation observed in the bound exciton emission, unless the bound exciton emission is totally quenched everywhere by them.

The presence of a strong free exciton indicates the substantial absence of defects such as dislocations and impurities. The link between low defect and impurity densities and high FE emission has been previously reported for individual crystals in polycrystalline CVD diamond synthesis. At higher boron levels, typically greater than 20–25 ppm in the solid, the free exciton emission is eventually quenched by the high boron point defect density and not due to crystalline defects such as dislocations. Uniformity of the free exciton emission is a good measure of the lack of local high densities of defects.

SIMS analysis was typically performed $O_2^+$ primary beam, With a primary voltage of 10 kV, a beam current of typically 1 μA and a spatial resolution of less than 50 μm. Mapping was typically completed by stepping the analysis point on a 0.5 mm or 1 mm pitch over the face of the layer, obtaining from each face typically a minimum of 20 points and more preferably a minimum of 40 points. Calibration was by comparison with implant standards. Data from the SIMS was analysed by finding the mean of the dataset, and then finding the full range of the data expressed as a percentage of the mean for the different % fractions of the dataset, with the two opposite major faces of a layer given approximately equal weighting in order to characterise a volume. Reproducibility of the SIMS is typically of the order of 3–5%, dependent on conditions, with a detection limit around $2-5 \times 10^{14}$ atoms/cm$^3$.

In order to characterise a volume of material, typically the two opposite surfaces were characterised by SIMS and BE/FE mapping, and the through thickness sample by IR absorption.

The resolution of the measurement technique (SEM analysis for BE, FE and uncompensated boron concentration, and SIMS analysis for total boron concentration), is relevant to the types of variations in boron concentration which can be observed in diamond. For example, in polycrystalline diamond, with a typical grain size of 100 μm, a 1 mm analysis spot scanned across the sample may average out and thus not observe the substantial variations of B concentration found between individual grains or growth sectors. By taking a sample of 20 or more datapoints with a resolution of 50 μm or less, it is possible to demonstrate that such small scale variations are not present.

It is important for the production of the uniformly boron doped CVD diamond single crystal layer of the invention that growth takes place on a diamond surface which is substantially free of crystal defects. In this context, defects primarily mean dislocations and micro cracks, but also include twin boundaries, point defects, low angle boundaries and any other disruption to the crystal structure. Preferably the substrate is a low birefringence type Ia natural, Ib or IIa high pressure/high temperature synthetic diamond or a CVD synthesised single crystal diamond. Defects can degrade the material in two ways, adversely affecting the electronic properties (e.g. the hole mobility) and also influencing the local uptake of boron. Since dislocation multiplication occurs during the growth of thick layers, the control of dislocations within the substrate and early stages of growth is particularly important.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as 50/mm$^2$ with more typical values being $10^2$/mm$^2$, whilst in others it can be $10^6$/mm$^2$ or greater.
2) Those resulting from polishing, including dislocation structures and microcracks forming chatter tracks (sometimes known as clatter tracks) along polishing lines. The density of these can vary considerably over a sample, with typical values ranging from about $10^2$/mm$^2$, up to more than $10^4$/mm$^2$ in poorly polished regions or samples.

The preferred low density of defects is such that the density of surface etch features related to defects, as described above, is below $5 \times 10^3$/mm$^2$, and more preferably below $10^2$/mm$^2$.

The defect level at and below the substrate surface on which the CVD growth takes place may thus be minimised by careful preparation of the substrate. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete. Particular processing steps may include conventional diamond processes such as mechanical sawing, lapping and polishing (in this application specifically optimised to yield low defect levels), and less conventional techniques such as laser processing or ion implantation and lift off techniques, chemical/mechanical polishing, and both liquid and plasma chemical processing techniques. In addition, the surface $R_Q$ (root mean square deviation of surface profile from flat measured by stylus profilometer, preferably measured over 0.08 mm length) should be minimised, typical values prior to any plasma etch being no more than a few nanometers, i.e. less than 10 nanometers.

One specific method of minimising the surface damage of the substrate, is to include an in situ plasma etch on the surface on which the homoepitaxial diamond growth is to occur. In principle this etch need not be in situ, nor immediately prior to the growth process, but the greatest benefit is achieved if it is in situ, because this avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of:

(i) an oxygen etch using predominantly hydrogen with optionally a small amount of Ar and a required small amount of $O_2$. Typical oxygen etch conditions are pressures of $50–450\times10^2$ Pa, an etching gas containing an oxygen content of 1 to 4 percent, an argon content of 0 to 30 percent and the balance hydrogen, all percentages being by volume, with a substrate temperature 600–1100° C. (more typically 800° C.) and a typical duration of 3–60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moves directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma into the gas phase or to the substrate surface. The hydrogen etch following the oxygen etch is less specific to crystal defects, rounding off the angularities caused by the oxygen etch which aggressively attacks such defects and providing a smoother, better surface for subsequent growth.

The surface or surfaces of the diamond substrate on which the CVD diamond growth occurs are preferably the {100}, {110}, {113} or {111} surfaces. Due to processing constraints, the actual sample surface orientation can differ from these ideal orientations up to 5°, and in some cases up to 10°, although this is less desirable as it adversely affects reproducibility.

It is also important in the method of the invention that the impurity content of the environment in which the CVD growth takes place is properly controlled. More particularly, the diamond growth must take place in the presence of an atmosphere containing substantially no contaminants, and that the intentionally added boron (and nitrogen if used) concentrations are suitably controlled. The degree of control required for the boron and nitrogen dopant concentrations is application dependent, but typically needs to be stable to better than 20% and, more typically better than 10%, and even more typically better than 3%. Such control requires careful control of the nitrogen impurities in the source gas, as nitrogen is a common contaminant. In order to achieve this degree of control, the level of nitrogen in the source gas, prior to the deliberate nitrogen addition, is generally maintained at less than 500 parts per billion in the gas phase (as a molecular fraction of the total gas volume), and preferably less than 300 parts per billion, and more preferably less than 100 parts per billion. Measurement of absolute and relative nitrogen (and boron) concentrations in the gas phase at concentrations as low as 100 ppb requires sophisticated monitoring equipment such as that which can be achieved, for example, by gas chromatography. An example of such a method is now described:

Standard gas chromatography (GC) art consists of: A gas sample stream is extracted from the point of interest using a narrow bore sample line, optimised for maximum flow velocity and minimum dead volume, and passed through the GC sample coil before being passed to waste. The GC sample coil is a section of tube coiled up with a fixed and known volume (typically 1 $cm^3$ for standard atmospheric pressure injection) which can be switched from its location in the sample line into the carrier gas (high purity He) line feeding into the gas chromatography columns. This places a sample of gas of known volume into the gas flow entering the column; in the art, this procedure is called sample injection.

The injected sample is carried by the carrier gas through the first GC column (filled with a molecular sieve optimised for separation of simple inorganic gases) and is partially separated, but the high concentration of primary gases (e.g. $H_2$, Ar) causes column saturation which makes complete separation of, for example nitrogen difficult. The relevant section of the effluent from the first column is then switched into the feed of a second column, thereby avoiding the majority of the other gases being passed into the second column, avoiding column saturation and enabling complete separation of the target gas ($N_2$). This procedure is called "heart-cutting".

The output flow of the second column is put through a discharge ionisation detector (DID), which detects the increase in leakage current through the carrier gas caused by the presence of the sample. Chemical identity is determined by the gas residence time which is calibrated from standard gas mixtures. The response of the DID is linear over more than 5 orders of magnitude, and is calibrated by use of specially prepared gas mixtures, typically in the range of 10–100 ppm, made by gravimetric analysis and then verified by the supplier. Linearity of the DID can be verified by careful dilution experiments.

This known art of gas chromatography has been further modified and developed for this application as follows: The processes being analysed here are typically operating at $50–500\times10^2$ Pa. Normal GC operation uses the excess pressure over atmospheric pressure of the source gas to drive the gas through the sample line. Here, the sample is driven by attaching a vacuum pump at the waste end of the line and the sample drawn through at below atmospheric pressure. However, whilst the gas is flowing the line impedance can cause significant pressure drop in the line, affecting calibration and sensitivity. Consequently, between the sample coil and the vacuum pump is placed a valve which is shut for a short duration before sample injection in order to enable the pressure at the sample coil to stabilise and be measured by a pressure gauge. To ensure a sufficient mass of sample gas is injected, the sample coil volume is enlarged to about 5 $cm^3$. Dependent on the design of the sample line, this technique can operate effectively down to pressures of about $70\times10^2$ Pa. Calibration of the GC is dependent on the mass of sample injected, and the greatest accuracy is obtained by calibrating the GC using the same sample pressure as that available from the source under analysis. Very high standards of vacuum and gas handling practice must be observed to ensure that the measurements are correct.

The point of sampling may be upstream of the synthesis chamber to characterise the incoming gases, within the chamber to characterise the chamber environment, or downstream of the chamber.

Typically B was added to the process as $B_2H_6$ using a calibrated source of nominally 100 ppm $B_2H_6$ in $H_2$ to simplify control, and likewise the nitrogen was added to the process as $N_2$ using a calibrated source of nominally 100 ppm $N_2$ in $H_2$ to simplify control. Additions of both B and N are expressed as ppm, calculated for B as $[B_2H_6]/[All\ gases]$ where $[B_2H_6]$ represents the number of moles of $B_2H_6$ and [All gases] represents the number of moles of all gases present, and likewise as $[N_2]/[All\ gases]$ for $N_2$.

The gas mixture used in the synthesis process may contain any gases known in the art and will contain a carbon-containing material which dissociates producing radicals or other reactive species. The gas mixture will also generally contain gases suitable to provide hydrogen or a halogen in atomic form.

The dissociation of the source gas is preferably carried out using microwave energy in a reactor examples of which are known in the art. However, the transfer of any impurities from the reactor should be minimised. A microwave system may be used to ensure that the plasma is placed away from all surfaces except the substrate surface on which diamond growth is to occur and its mount, the substrate carrier. Examples of a preferred mount materials are: molybdenum, tungsten, silicon and silicon carbide. Examples of preferred reactor chamber materials are stainless steel, aluminium, copper, gold, platinum.

A high plasma power density should be used, resulting from high microwave power (typically 1–60 kW, for substrate carrier diameters of 25–300 mm) and high gas pressures (50–500×10$^2$ Pa, and preferably 100–450×10$^2$ Pa).

Using the above conditions it has been possible to produce thick high quality boron doped single crystal CVD diamond layers with charge carriers of unusually high mobility and with a morphology optimised for the production of uniform large volumes suitable for commercial products.

Some examples of the invention will now be described.

EXAMPLE 1

Substrates suitable for synthesising single crystal CVD diamond of the invention may be prepared as follows:
  (i) Selection of stock material (Ia natural stones and Ib HPHT stones) was optimised on the basis of microscopic investigation and birefringence imaging to identify substrates which were free of strain and imperfections.
  (ii) Laser sawing, lapping and polishing to minimise subsurface defects using a method of a revealing plasma etch to determine the defect levels being introduced by the processing.
  (iii) After optimisation it was possible routinely to produce substrates having one or more surfaces in which the density of defects measurable after a revealing etch is dependent primarily on the material quality and is below $5 \times 10^3/mm^2$, and generally below $10^2/mm^2$. Substrates prepared by this process are then used for the subsequent synthesis A high temperature/high pressure synthetic 1b diamond was grown in a high pressure press, and as a substrate using the method described above to minimise substrate defects to form a polished plate $7.65 \times 8.25$ mm$^2$ by 0.54 mm thick, with all faces {100}. The surface roughness $R_Q$ at this stage was less than 1 nm. The substrate was mounted on a tungsten substrate carrier using a high temperature diamond braze. This was introduced into a reactor and an etch and growth cycle commenced as described above, and more particularly:
  1) The 2.45 GHz microwave reactor was pre-fitted with point of use purifiers, reducing unintentional contaminant species in the incoming gas stream to below 80 ppb.
  2) An in situ oxygen plasma etch was performed using 15/75/600 sccm (standard cubic centimetre per minute) of $O_2/Ar/H_2$ at $270 \times 10^2$ Pa and a substrate temperature of 753° C. for a period of 10 minutes.
  3) This moved without interruption into a hydrogen etch with the removal of the $O_2$ from the gas flow, at a temperature of 758° C. for a period of 10minutes. 4) This moved into the growth process by the addition of the carbon source (in this case $CH_4$) and dopant gases. The $CH_4$ flow was at 30 sccm. $B_2H_6$ was used as the source of boron dopant. The $B_2H_6$ gas phase concentration was 1.4 ppm. The temperature was 780° C.
  4) On completion of the growth period, the substrate was removed from the reactor and the CVD diamond layer grown on a surface of low defect density, as described above, removed from the substrate.
  5) This layer was then polished flat to produce a uniformly doped 735 μm thick layer with <100> edges and lateral dimensions about $5 \times 5$ mm$^2$.
  6) This layer, identified as CD-1, was cleaned and oxygen ashed to a surface terminated by $O_2$ and tested for its mobility using the Hall technique. This was found to be 360 cm$^2$/Vs at 300K, and 185 cm$^2$/Vs at 440K. This data is consistent with a $T^{-3/2}$ dependence predicted by a model of acoustic phonon scattering.
  7) The layer was analysed using SIMS, and measured to have a uniform total B concentration of $6.2 \times 10^{18}$ atoms/cm$^3$.
  8) The carrier concentration was measured using the Hall technique and found to be $4.5 \times 10^{13}$ at 200 K, $4 \times 10^{15}$ at 300 K, and $1.6 \times 10^{17}$ at 500 K. Based on a carrier concentration of $4 \times 10^{15}$ at 300 K, equation (1) giving the upper bounds of reported material would predict a mobility of 163 cm$^2$/Vs, compared with the measured value of 360 cm$^2$/Vs. Thus G, the factor (defined in equation 1 above), showed an improvement or gain over prior art materials of greater than 2.2.

EXAMPLE 2

The procedure set out in Example 1 was repeated with the following variation in conditions:
  1) The polished HPHT substrate plate was $5 \times 5$ mm square by 500 μm thick, with all faces {100}.
  2) The in situ oxygen plasma etch was performed using 15/75/600 sccm of $O_2/Ar/H_2$ at $333 \times 10^2$ Pa and a substrate temperature of 800° C. for a period of 30 minutes.
  3) This was followed by a 30 minute hydrogen etch, in which the $O_2$ was removed from the process stream and a temperature of 810° C. recorded.
  4) The growth process was initiated by the addition of $CH_4$ flowing at 36 sccm, and $B_2H_6$ and $N_2$ flows to give gas phase concentrations of 0.05 and 7 ppm, respectively. The temperature was 812° C.
  5) On completion of the growth period, the substrate was removed from the reactor and the CVD diamond layer removed from the substrate.
  6) This layer, identified as CD-2, was then polished flat to produce a 410 μm thick layer with <110> edges and lateral dimensions $7 \times 7$ mm$^2$.
  7) The layer was analysed using SIMS, and a series of measurements showed the layer to have a uniform boron concentration of $6.1 \times 10^{16}$ atoms/cm$^3$. SIMS mapping of the B concentration showed no variation in concentration within the resolution of the mapping capability, which had a lateral spatial resolution less than 30 mm and a sensitivity at the level of measurement of better than 10%. The nitrogen concentration was measured to be less than $5\times10^{15}$ atoms/cm$^3$.

8) This layer CD2 was cleaned and oxygen ashed to a surface terminated by O$_2$ and tested for its mobility and carrier concentration. The carrier concentration was measured to exceed $4.5\times10^{13}$ and the mobility was measured to exceed $2.5\times10^3$ cm$^2$/Vs, giving a value for G of about 1.5.

9) CD-2 was further characterised by the data provided below:
   (i) The CL spectra showing free and bound exitons and no other features
   (ii) EPR spectra, showed no neutral substitutional nitrogen and only a weak line at g=2.0028
   (iii) Optical spectra showing the near theoretical transmission beside the characteristic absorption associated with a uncompensated boron concentration of $6.5\times10^{16}$ atoms/cm$^3$.
   (iv) X-ray rocking curves map, showing the angular spread of the sample to be less than 10 arc sec.
   (v) Raman spectrum showing a line width (FWHM) to be approximately 2 cm$^{-1}$.

EXAMPLE 3

The procedure set out in Example 1 was repeated with the following variation in the growth conditions:
Ar 75 sccm, H$_2$ 600 sccm, CH$_4$ 30 sccm, $330\times10^2$ Pa, 795° C., 4.4 kW, boron and nitrogen gas phase concentrations of 15 and 0.5 ppm respectively. The CVD diamond layer grown was then suitably processed and analysed on both surfaces of the layer which was 300 μm thick.

On the top surface, a SIMS map showed a boron concentration of $1.75\times10^{19}$ cm$^{-3}$ and on the opposite side an average SIMS concentration of $1.98\times10^{19}$ cm$^{-3}$.

EXAMPLE 4

The procedure set out in Example 1 was repeated with the following variation in the growth conditions:
Ar 50 sccm, H$_2$ 600 sccm, CH$_4$ 40 sccm, $330\times10^2$ Pa, 795° C., 4.4 kW, boron and nitrogen gas phase concentrations of 0.05 and 0.7 ppm respectively. The CVD diamond layer grown was then suitably processed and analysed on both surfaces of the layer which was 113 μm thick.

On the top surface, SIMS maps were obtained on both a 0.5 mm pitch over an area of 2 mm×4.5 mm, and over the larger area of 5 mm×6 mm on a 1 mm pitch. Data on the back surface was obtained on a 1 mm pitch. The volume under analysis was thus 3.4 mm$^3$ On the front surface the mean boron concentration was measured to be 0.56, and on the back surface 0.52 ppm. The percentage volume of the material thus conforming to a particular range of concentrations about the mean was thus determined to be as shown in Table 1:

TABLE 1

SIMS concentration and distribution analysis for B on 1 mm pitch SIMS

| Criteria | Units | De-tails | Surface Top | Bottom | Volume |
|---|---|---|---|---|---|
| Mean B conc$^n$ (ppm) | ppm | 1.0 mm pitch | 0.56 | 0.52 | 0.54 |

TABLE 1-continued

SIMS concentration and distribution analysis for B on 1 mm pitch SIMS

| Criteria | Units | De-tails | Surface Top | Bottom | Volume |
|---|---|---|---|---|---|
| Range of values | % | 100% | −24% to +23% | −14% to +16% | −21% to +27% (range 48%) |
| | | 95% | −17% to +20% | −14% to +11% | −17% to +18% (range 35%) |
| | | 85% | −11% to +14% | −11% to +11% | −15% to +13% (range 28%) |
| | | 70% | −9% to +9% | −7% to +9% | −9% to +10% (range 19%) |

Thus, from Table 1 it can be seen that 100% of the B measurements fell within a total range of 47% on the top face of the sample, and within a range of 30% on the rear face of the sample, and within a range of 48% for both major surfaces bounding the volume under analysis combined. Similarly, 70% of these measurements fell within a range of 19% for both faces combined The nitrogen concentration was measured in the layer to be less than 0.06 ppm, this upper limit being set by the sensitivity under the conditions used for the measurements.

The back surface of the sample was further analysed in the SEM using the MonoCL system for the FE and BE intensity, aquiring data over a 6×6 array (36 datapoints) on a 1 mm pitch, with the results shown in Table 2.

TABLE 2

Distribution of FE and BE measurements

| % of measurements included | Full range of values (as % of mean) | | | | | |
|---|---|---|---|---|---|---|
| | Top | | | Bottom | | |
| | BE | FE | BE/FE | BE | FE | BE/FE |
| 100% | | | | 41 | 34 | 31 |
| 95% | | | | 39 | 29 | 28 |
| 90% | | | | 25 | 18 | 25 |
| 85% | | | | 20 | 15 | 24 |
| 70% | | | | 14 | 12 | 17 |

Thus, 90% of the measurements on the bottom face of the sample fell within a total range about the mean of 25% for the free exciton, 18% for the bound exciton, and 25% for the BE/FE ratio.

EXAMPLE 5

A layer was grown by the process described in Example 4. This was then suitably processed and analysed on front and back surfaces of a layer 233 μm thick. The volume under analysis was 7.0 mm$^3$ The boron concentration was determined to be 0.34 ppm in the top face, 0.29 ppm in the bottom face, with a average of 0.32 ppm. The percentage volume of the material conforming to a particular range of concentrations about the mean were thus determined to be as shown in Table 3:

TABLE 3

Distribution SIMS B measurements

| % Volume of Layer | Bounds and Range of B Concentration measurements as percentage of mean | | |
|---|---|---|---|
| | Lower bound | Upper bound | Range |
| 100% | −22% | +24% | 46% |
| 95% | −21% | +19% | 40% |
| 85% | −13% | +13% | 26% |
| 70% | −10% | +9% | 19% |

The nitrogen concentration was measured in the layer to be less than 0.03 ppm, this upper limit being set by the sensitivity under the conditions used for the measurements:

The front and back surfaces of the sample were further analysed in the SEM using the MonoCL system for the FE and BE intensity, aquiring data over a 6×6 array (36 datapoints) on a 1 mm pitch with the results shown in Table 4.

TABLE 4

Distribution of FE and BE measurements

| % of measurements included | Full range of values (as % of mean) | | | | | |
|---|---|---|---|---|---|---|
| | Top | | | Bottom | | |
| | BE | FE | BE/FE | BE | FE | BE/FE |
| 100% | 20 | 14 | 26 | 19 | 29 | 32 |
| 95% | 16 | 12 | 22 | 17 | 24 | 21 |
| 90% | 13 | 11 | 18 | 14 | 21 | 17 |
| 85% | 11 | 9 | 17 | 13 | 14 | 14 |
| 70% | 10 | 8 | 14 | 11 | 9 | 12 |

Using the top and bottom major faces of the layer as two representitive surfaces, this shows that 90% of the measurements taken for the bound exciton, free exciton, and BE/FE ratio all fall within a spread of substantially less than 30% about the mean.

EXAMPLE 6

A layer was grown by the process described in Example 4. This was then suitably processed and analysed on both front and back surfaces of a layer 538 μm thick. The volume under analysis was 16.1 mm$^3$ The boron concentration was determined to be 0.52 ppm in the front surface, 0.34 ppm in the back surface, with a average of 0.43 ppm. 70% of the volume of this layer was determined to lie in the range of −23.3 to +23.4 of the mean, a total range of 46.7%.

SIMS mapping for boron was then repeated on the growth face with a resolution of less than 30 μm, to further demonstrate the local uniformity of boron uptake, with the results shown in Table 5 below. Analysis for elements other than carbon showed no impurities above a detection limit of 0.5 ppm.

The nitrogen concentration was measured in the layer to be less than 0.03 ppm, this upper limit being set by the sensitivity under the conditions used for the measurements.

The front and back surfaces of the sample were further analysed in the SEM using the MonoCL system for the FE and BE intensity, aquiring data over a 6×6 array (36 datapoints) on a 1 mm pitch, with the results shown in Table 5.

TABLE 5

Distribution of B concentration and FE and BE measurements

| % of measurements included | Full range of values (as % of mean) | | | | | | | | |
|---|---|---|---|---|---|---|---|---|---|
| | Top | | | | | Bottom | | | |
| | B conc*$^1$ | B conc*$^2$ | BE | FE | BE/FE | B conc*$^2$ | BE | FE | BE/FE |
| 100% | 25 | 30 | 41 | 33 | 30 | 29 | 20 | 13 | 25 |
| 95% | 24 | 24 | 39 | 28 | 27 | 25 | 16 | 12 | 22 |
| 90% | | | 25 | 18 | 24 | | 13 | 10 | 18 |
| 85% | 15 | 22 | 19 | 15 | 23 | 16 | 11 | 8 | 17 |
| 70% | 12 | 14 | 14 | 12 | 17 | 9 | 9 | 8 | 13 |

*$^1$SIMS, <30 μm resolution
*$^2$SIMS, <50 μm resolution

This layer was also mapped using IR absorption over an area of 5×5 mm (36 datapoints) on a 1 mm pitch to measure the variation in uncompensated boron. 90% of the measurements fell within a full range of 34% about the mean value.

The Raman/photoluminescence spectrum of the plate was measured at 77 K, using argon ion laser light at 514 nm. The spectrum was dominated by the diamond Raman line at approx. 1332 cm$^{-1}$ which has a line width (FWHM) of 1.6 cm$^{-1}$; The zero-phonon lines at 575 nm and 637 nm were below detection, giving a maximum value to the ratio of their respective peak intensities to the Raman peak intensity of 1:1000.

EXAMPLE 7

A layer was grown by the process described in Example 4. This was then processed into a layer 818 μm thick and mapped using IR absorption over an area of 5×5 mm (36 datapoints) on a 1 mm pitch to measure the variation in uncompensated B. 90% of the measurements fell within a full range of 13% about the mean value.

We claim:

1. A layer of single crystal boron doped diamond produced by CVD wherein the total boron concentration is uniform, with a variation over the majority volume which is less than 50%, measured with a lateral resolution at each measurement point of less than 50 μm, wherein the majority volume represents at least 70% of the total volume of the layer, and wherein the layer has at least one of the following characteristics (i) to (iii):

(i) the layer is formed from a single growth sector,
(ii) the layer thickness exceeds 100 μm, and
(iii) the volume of the layer exceeds 1 mm³.

2. A diamond layer according to claim 1 wherein the variation over the majority volume is less than 20%.

3. A diamond layer according to claim 1 wherein the variation is measured with a lateral resolution at each measurement point of less than 30 μm.

4. A diamond layer according to claim 1 wherein the majority volume of the layer contains an uncompensated boron concentration greater than $1\times10^{14}$ atoms/cm³ and less than $1\times10^{20}$ atoms/cm³.

5. A diamond layer according to claim 1 wherein the majority volume of the layer contains an uncompensated boron concentration greater than $1\times10^{15}$ atoms/cm³ and less than $2\times10^{19}$ atoms/cm³.

6. A diamond layer according to claim 1 wherein the majority volume of the layer contains an uncompensated boron concentration greater than $5\times10^{15}$ atoms/cm³ and less than $2\times10^{18}$ atoms/cm³.

7. A diamond layer according to claim 1 which has a hole mobility ($\mu_h$) measured at 300K which exceeds $$\mu_h = G\times 2.1\times 10^{10}(N_h^{0.52})$$

for $N_h$ not exceeding $8\times10^{15}$ atoms/cm³ (Equation (1))

$$\mu_h = G\times 1\times 10^{18}/N_h$$

for $N_h$ greater than $8\times10^{15}$ atoms/cm³ (Equation (2))

where $N_h$ is the concentration of holes, and G has a value greater than 1.1.

8. A diamond layer according to claim 7 wherein G has a value greater than 1.4.

9. A diamond layer according to claim 7 wherein G has a value greater than 1.7.

10. A diamond layer according to claim 7 wherein G has a value greater than 2.

11. A diamond layer according to claim 1 which has low or absent luminescent features at 575 and 637 nm, relating to N-V centres.

12. A diamond layer according to claim 1 wherein the ratio of each of the integrated nitrogen vacancy centre zero-phonon lines at 575 nm and 637 nm with the integrated intensity of the diamond Raman line at 1332 cm$^{-1}$ when measured at 77 K with 514 nm Ar ion laser excitation, is less than 1/50.

13. A diamond layer according to claim 12 wherein the ratio is less than 1/100.

14. A diamond layer according to claim 12 wherein the ratio is less than 1/300.

15. A diamond layer according to claim 1 which has a Raman line width as measured at 300 K of less than 4 cm$^{-1}$ FWHW under 514 nm Ar ion excitation.

16. A diamond layer according to claim 15 wherein the Raman line width is less than 3 cm$^{-1}$ FWHW.

17. A diamond layer according to claim 15 wherein the Raman line width is less than 2.5 cm$^{-1}$ FWHW.

18. A diamond layer according to claim 1 wherein the frequency distribution of uncompensated boron measurements taken by FTIR over a representative sample taken from the layer is such that 90% of the measurements vary by less than 50% of the mean.

19. A diamond layer according to claim 1 wherein the frequency distribution of uncompensated boron measurements taken by FTIR over a representative sample taken from the layer is such that 90% of the measurements vary by less than 30% of the mean.

20. A diamond layer according to claim 1 wherein the frequency distribution of the BE taken over any representative surface of the layer or a sample taken from the layer is such that 90% of the measurements vary by less than 50% of the mean.

21. A diamond layer according to claim 1 wherein the frequency distribution of the BE taken over any representative surface of the layer or a sample taken from the layer is such that 90% of the measurements vary by less than 30% of the mean.

22. A diamond layer according to claim 1 wherein the frequency distribution of FE measurements taken over any representative surface of the layer or sample taken from the layer is such that 90% of the measurements vary by less than 50% of the mean.

23. A diamond layer according to claim 1 wherein the frequency distribution of FE measurements taken over any representative surface of the layer or sample taken from the layer is such that 90% of the measurements vary by less than 30% of the mean.

24. A diamond layer according to claim 1 wherein the majority volume represents greater than 85% of the total volume of the layer.

25. A diamond layer according to claim 1 wherein the majority volume represents greater than 95% of the total volume of the layer.

26. A diamond layer according to claim 1 wherein the layer is formed from a single growth sector which is one of the {100}, the {113}, the {111} and the {110} sectors.

27. A diamond layer according to claim 1 which has a thickness exceeding 500 μm.

28. A diamond layer according to claim 1 which has a volume exceeding 3 mm³.

29. A diamond layer according to claim 1 which has a volume exceeding 10 mm³.

30. A diamond layer according to claim 1 which further contains nitrogen as a dopant.

31. A diamond layer according to claim 30 wherein nitrogen concentration is no greater than 1/5 that of the boron concentration.

32. A diamond layer according to claim 30 which contains a nitrogen concentration of less than 1/50 that of the boron concentration.

33. A diamond layer according to claim 1, wherein the layer has at least characteristic (i).

34. A diamond layer according to claim 1, wherein the layer has at least characteristic (ii).

35. A diamond layer according to claim 1, wherein the layer has at least characteristic (iii).

36. A diamond body in which a diamond layer according to claim 1 forms a layer or region thereof.

37. An element produced from a diamond layer according to claim 1 or from a diamond body according to claim 36.

38. A diamond body according to claim 36 or a diamond layer according to claim 1 in the form of a gemstone.

39. A diamond layer according to claim 2 wherein the variation is measured with a lateral resolution at each measurement point of less than 30 μm.

40. A method of producing a layer of single crystal boron doped diamond including the steps of providing a diamond substrate having a surface which is substantially free of crystal defects, providing a source gas, such source gas including a source of boron, dissociating the source gas and allowing homoepitaxial diamond growth on the surface which is substantially free of crystal defects, wherein said layer is that defined in claim 1.

41. A method according to claim 40 wherein the source gas has nitrogen added to it in an amount suitable to control the morphology developed by the growing single crystal diamond.

42. A method according to claim 41 wherein the nitrogen addition to the source gas is greater than 0.5 ppm and less than 10000 ppm.

43. A method according to claim 41 wherein the nitrogen addition to the source gas is greater than 1 ppm and less than 1000 ppm.

44. A method according to claim 41 wherein the nitrogen addition to the source gas is greater than 3 ppm and less than 200 ppm.

45. A method according to claim 40 wherein the density of surface etch features related to defects on the surface on which diamond growth occurs is below $5 \times 10^3/mm^2$.

46. A method according to claim 40 wherein the density of surface etch features related to defects on the surface on which diamond growth occurs is below $10^2/mm^2$.

47. A method according to claim 40 wherein the surface on which diamond growth occurs is subjected to a plasma etch prior to diamond growth.

48. A method according to claim 40 wherein the diamond growth occurs on a {100}, {110}, {113} or {111} surface.

49. A method according to claim 41 wherein the boron source is $B_2H_6$.

* * * * *